United States Patent
Barna (10) Patent No.: US 6,664,934 B2
(45) Date of Patent: Dec. 16, 2003

(54) RADIO ANTENNA MATCHING CIRCUIT (75) Inventor: Zsolt Barna, Budapest (HU)

(73) Assignee: Smarteq Wireless AB, Enebyberg (SE)

(*) Notice: Subject to any disclaimer, the term of this patent is extended or adjusted under 35 U.S.C. 154(b) by 0 days.

(21) Appl. No.: 09/956,831

(22) Filed: Sep. 21, 2001

(65) Prior Publication Data

US 2003/0058184 A1 Mar. 27, 2003

(51) Int. Cl.[7] .................................................. H01Q 1/50
(52) U.S. Cl. ........................ 343/860; 343/821; 333/32
(58) Field of Search .............................. 333/25, 26, 32; 343/860, 850, 821, 822, 859, 846, 829, 830

(56) References Cited

U.S. PATENT DOCUMENTS

| 5,528,252 A | 6/1996 | Skahill | 343/822 |
| 5,652,599 A | * | 7/1997 | Pitta et al. | 343/860 |

FOREIGN PATENT DOCUMENTS

| EP | 0613209 A1 | 8/1994 |
| GB | 2322493 A | 8/1998 |

OTHER PUBLICATIONS

Duncan et al, Proc of the IRE, pp. 156–164, Feb. 1959, 100:1 Bandwidth Balun Transformer.

Klopfenstein, Proc of the IRE, pp. 31–35, 1956, A Transmission Line Taper of Improved Design.

* cited by examiner

Primary Examiner—Michael C. Wimer
(74) Attorney, Agent, or Firm—Jacobson Holman PLLC (57) ABSTRACT

Matching circuit for radio antenna that functions on a two-frequency band which are spaced approximately at a distance of one octave, wherein the upper band is broad. For instance, the first frequency band may be 890–940 MHz and the other band 1710–2200 MHz. The radiator may be a dipole or a monopole over the earth plane, whose bandwidth is sufficient for the first band. The larger bandwidth for the second band is obtained with a transmission circuit that moves and forms the frequency curve stepwise in the Smith chart. When necessary, the matching circuit includes a broadband Balun transformer in addition to said matching circuit.

9 Claims, 10 Drawing Sheets

RADIO ANTENNA MATCHING CIRCUIT

BACKGROUND OF THE INVENTION

Small two band radiators for frequency bands around 900 MHz and 1800 MHz are available commercially although they are not sufficiently broadbanded to reach to frequencies of 2200 MHz. Further, very high broadband antennas are available, for instance the logarithmic periodic antennas, although these are too large and expensive for simpler applications.

Described in EP 0 613 209 A1, with the title "A two frequency impedance matching circuit" is a matching circuit for a simple whip antenna that enables roughly 50 Ohms matching at two frequencies to be achieved. In the preferred embodiment, these frequencies lie between 810 and 960 MHz. This implies that the antenna is broadbanded within this frequency band; see FIG. 7 of the patent specification.

The present invention has a different aim, as matching is strived for in two frequency bands that are widely separate from each other, of which at least one band is very wide.

SUMMARY OF THE INVENTION

The object of the invention is to provide a radio antenna that includes a matching circuit which functions on at least two different frequency bands, of which at least one is broad. Other objects are that the antenna shall be relatively small in relation to alternative solutions, and that it shall be relatively simple and economic to mass-produce. For instance, the matching circuit can be mounted on printed circuit boards. In some cases, the radiator may also be mounted on the same printed circuit board.

The invention has evolved as a result of the need to transmit and receive radio waves with a single antenna, within all of the following communications frequency band:

| | |
|---|---|
| GSM | 800–960 MHz |
| GSM | 1710–1880 MHz |
| GSM | 1850–1990 MHz |
| DECT | 1880–1900 MHz |
| UMTS | 1900–2200 MHz |

The invention will be described with reference to two preferred embodiments for these frequency bands. However, the invention can be also applied for other frequency ranges and other applications, and hence the principle of the invention will be described in more generality in the accompanying claims.

The frequency ranges with which the preferred embodiments are concerned will be designated in accordance with the following:

890–960 MHz will be referred to as the "first frequency band"

1710–2200 MHz will be referred to as the "second frequency band"

In this case, the three higher frequency bands have been combined into a broader band.

A complete antenna consists of radiator (5, 20) and matching circuit (8). The matching circuit always includes a transmission circuit (10, 21) and, when required, a Balun transformer (9). It is assumed that the radiator has low radiation resistance within a first frequency band and a high radiation resistance within a second frequency band.

The purpose of the transmission circuit (10, 21) is to transfer the electromagnetic wave from the antenna connection point, Port A—A, to the other end of the transmission circuit, Port F—F, so that its impedance values within both frequency bands will lie in the proximity of a common resistance value that corresponds to the impedance of the feeder, the Balun transformer, or the radio apparatus, illustrated at point O in the Smith chart of FIGS. 4 to 8 inclusive. When the antenna is balanced (e.g. dipole) and the supply line is unbalanced (e.g. a coaxial cable), the matching circuit (8) will also include a Balun transformer (9) whose Port G—G is matched to the unbalanced feeder.

Figure 9:
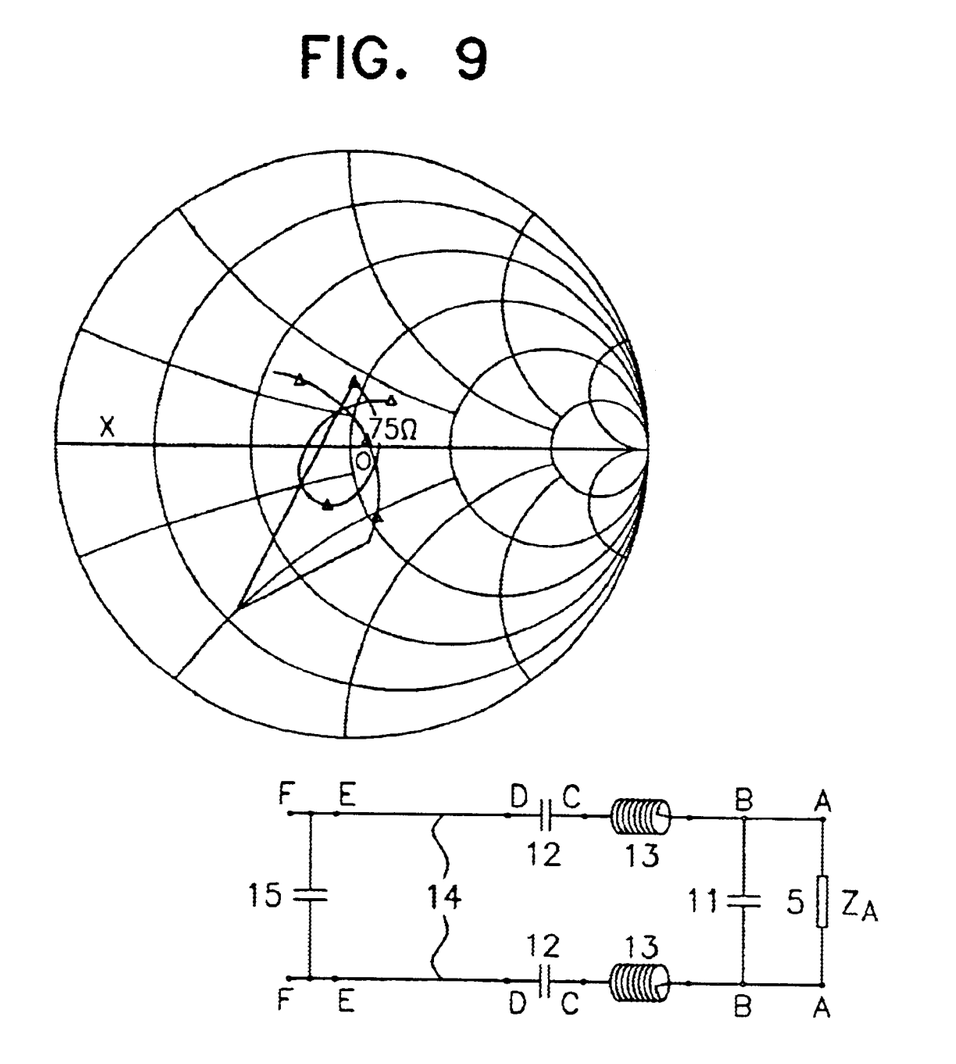
FIG. 9 is a Smith chart at point F—F in the coupling diagram
Figure 10:
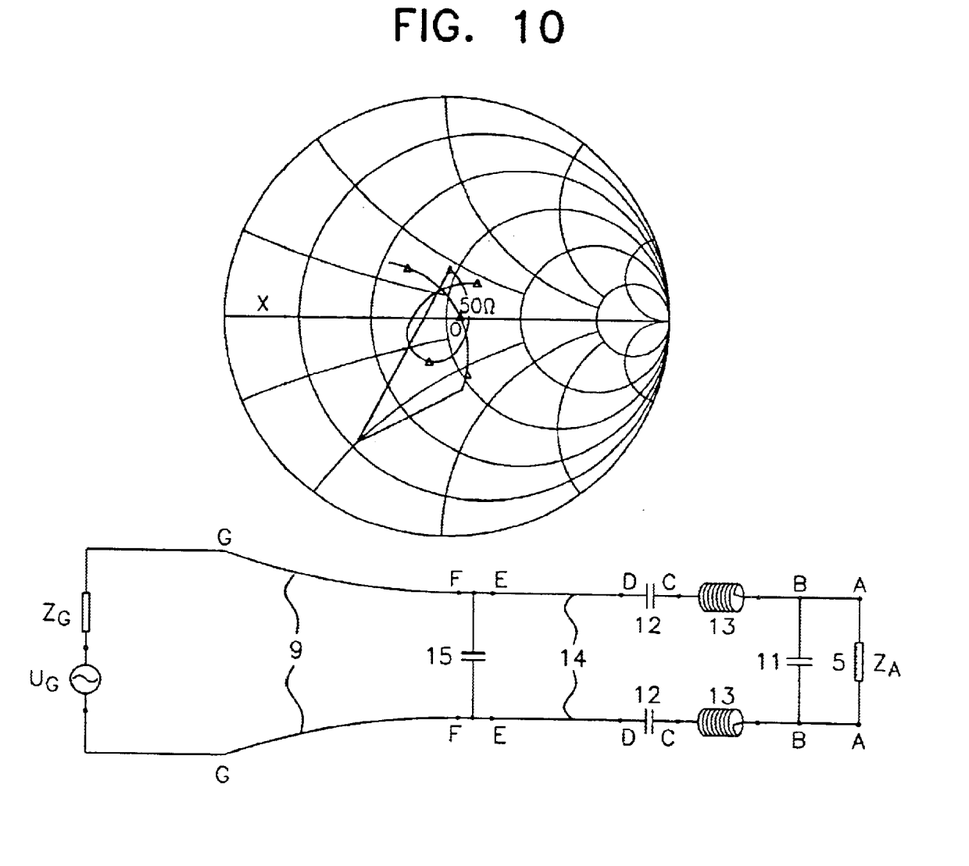
FIG. 10 illustrates the Smith chart of the entire antenna at port G—G in the first preferred embodiment, where an unbalanced feeder from the transceiver (not shown in the figure) can be connected.

The function of the transmission circuit is illustrated in the Smith chart in FIGS. 4–9, where it is shown how the impedance curve of the radiator is changed incrementally, so that the curve segment which lies in the frequency bands concerned is moved to the proximity of the centre point O in the Smith chart of FIG. 9.

The impedance of the radiator (5) in the Smith chart (FIG. 4) shows that the curve intersects the true axis at a first point (P) within the first frequency band, and at a second point (Q) within the second frequency band. The radiator (5) is thus resonant at these frequencies. The curve is moved down in the capacitive region of the Smith chart shown in FIG. 5, with the aid of parallel capacitor (11). The inductance (13) moves the curve to the inductive region and draws the curve together to form a small loop in accordance with FIG. 6. The curve is moved closer to the centre point (O) of the diagram in FIG. 7, with the aid of series capacitor (12), and its balance is improved in relation to the horizontal axis (X) of the diagram at the same time. The curve is then shifted through a phase angle of about 130° with the aid of a phase shift line (14), the result being shown in FIG. 8. We see here that the markers in the first band lie in the proximity of the horizontal axis (X), whereas the markers for the second band lie on a coherent loop in the inductive part of the Smith chart. This last-mentioned loop is moved with the aid of the parallel capacitance (15), so that it will lie around the centre point (O) in the Smith chart, see FIG. 9. The region for the first band is therewith influenced only to a small degree, as the parallel capacitance (15) influences the positions of the points in the Smith chart to a smaller degree at these low frequencies. Thus, as seen from the first port (A—A) to the second port (F—F), the transmission circuit (10) is comprised of parallel capacitor (11), series inductance (13), series capacitor (12), phase shifting line (14) and parallel capacitor (15), in that order.

The Balun transformer (9) will be described below in conjunction with the first preferred embodiment.

The Present Standpoint of Techniques

Small two band radiators for frequency bands around 900 MHz and 1800 MHz are available commercially although they are not sufficiently broadbanded to reach to frequencies of 2200 MHz. Further, very high broadband antennas are available, for instance the logarithmic periodic antennas, although these are too large and expensive for simpler applications.

Described in EP 0 613 209 A1, with the title "A two frequency impedance matching circuit" is a matching circuit for a simple whip antenna that enables roughly 50 Ohms matching at two frequencies to be achieved. In the preferred embodiment, these frequencies lie between 810 and 960 MHz. This implies that the antenna is broadbanded within this frequency band; see FIG. 7 of the patent specification. The present invention has a different aim, as matching is strived for in two frequency bands that are widely separate from each other, of which at least one band is very wide. 3

DESCRIPTION OF THE INVENTION

Figure 1:
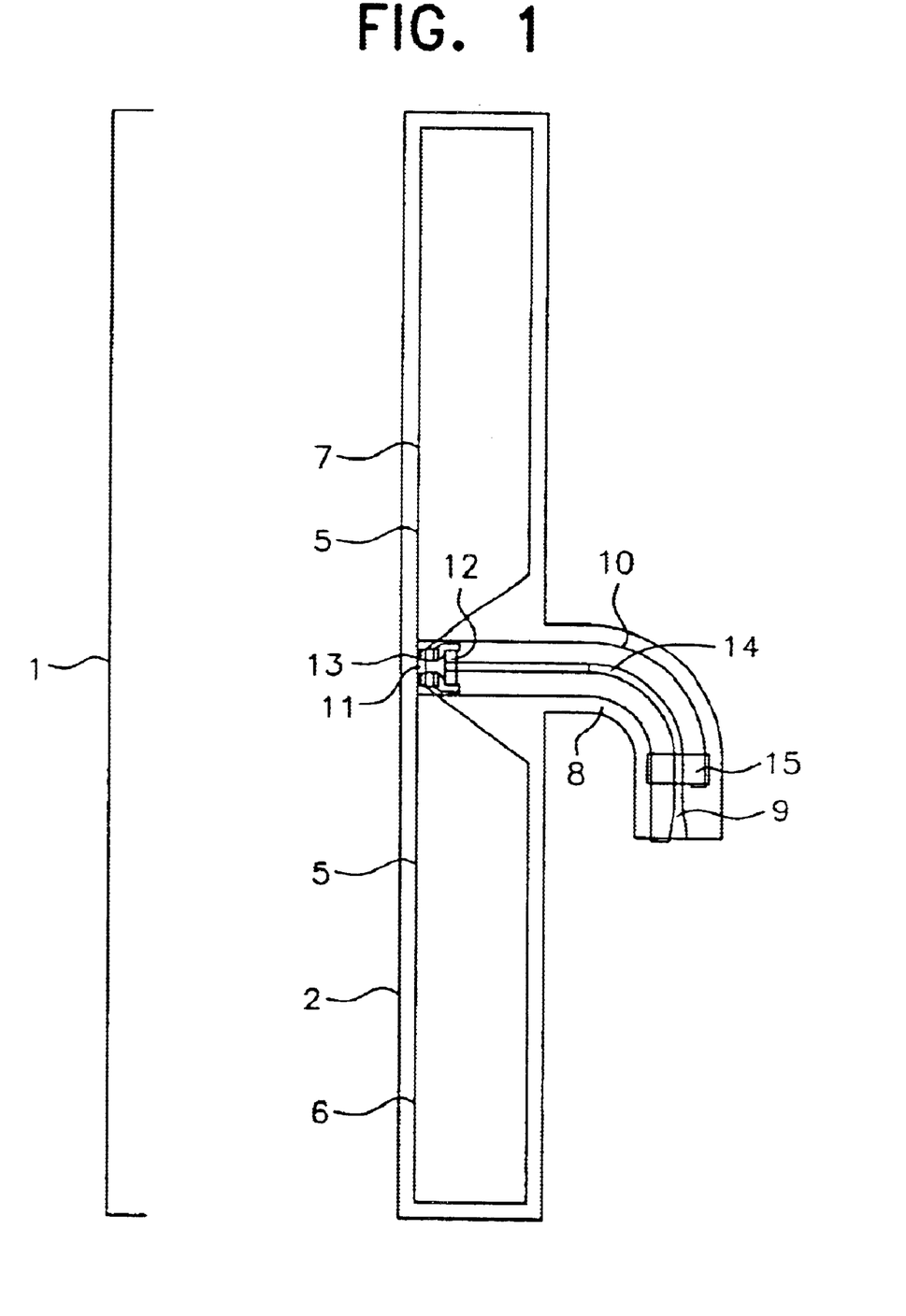
FIG. 1 illustrates an antenna that includes a balanced radiator and matching circuit in a first preferred embodiment.

A first preferred embodiment with balanced radiator:

The antenna (1) shown in FIG. 1 comprises two parts:

Radiator (5)

Matching circuit (8)

Both components are mounted on a printed circuit board (2) that has respective first and second sides (3 and 4). Both sides are metallised and carry printed patterns.

Figure 2:
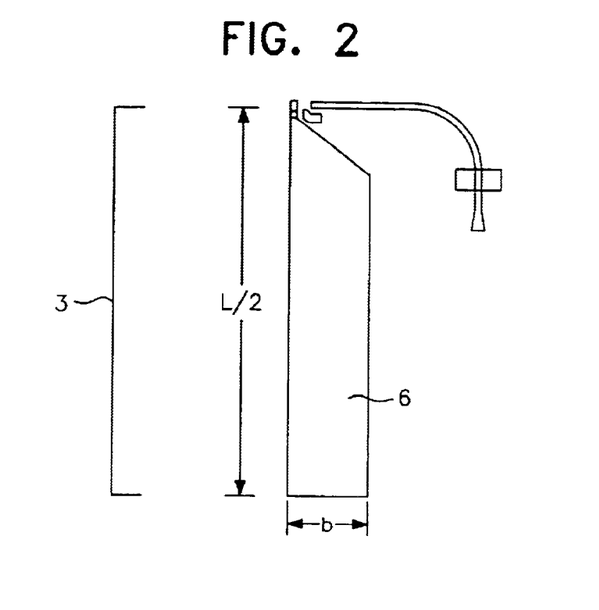
FIG. 2 illustrates the first side of a printed circuit board.
Figure 3:
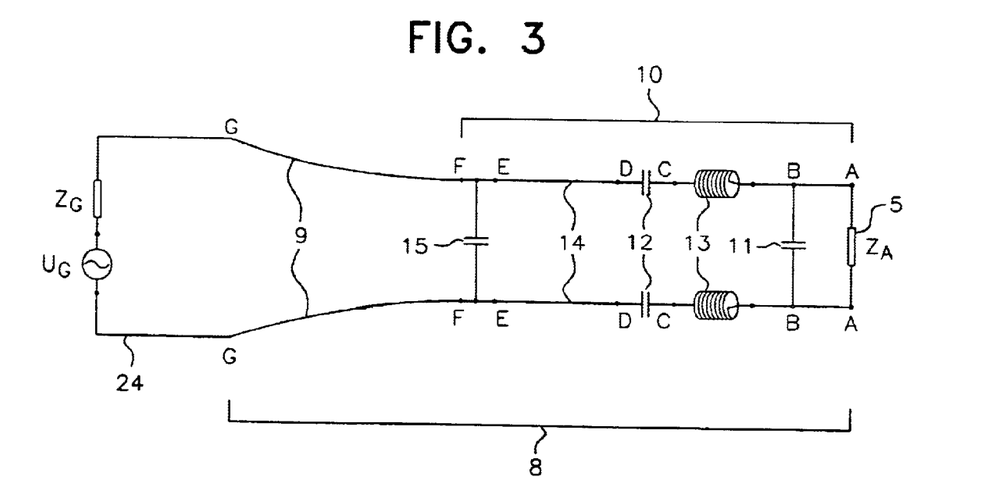
FIG. 3 illustrates a coupling diagram for the matching circuit.
Figure 4:
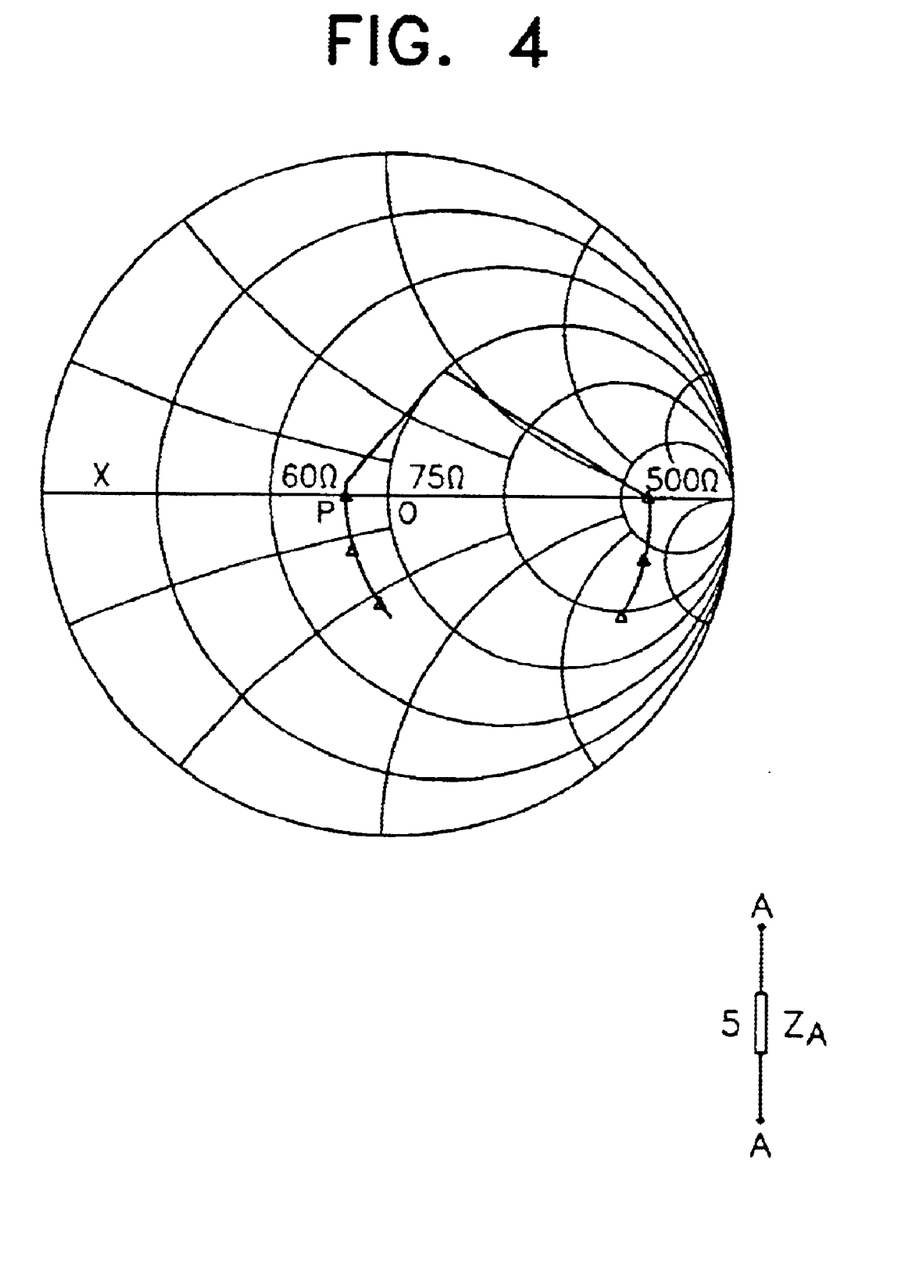
FIG. 4 is a Smith chart for the dipole at port A—A in the coupling diagram.
Figure 5:
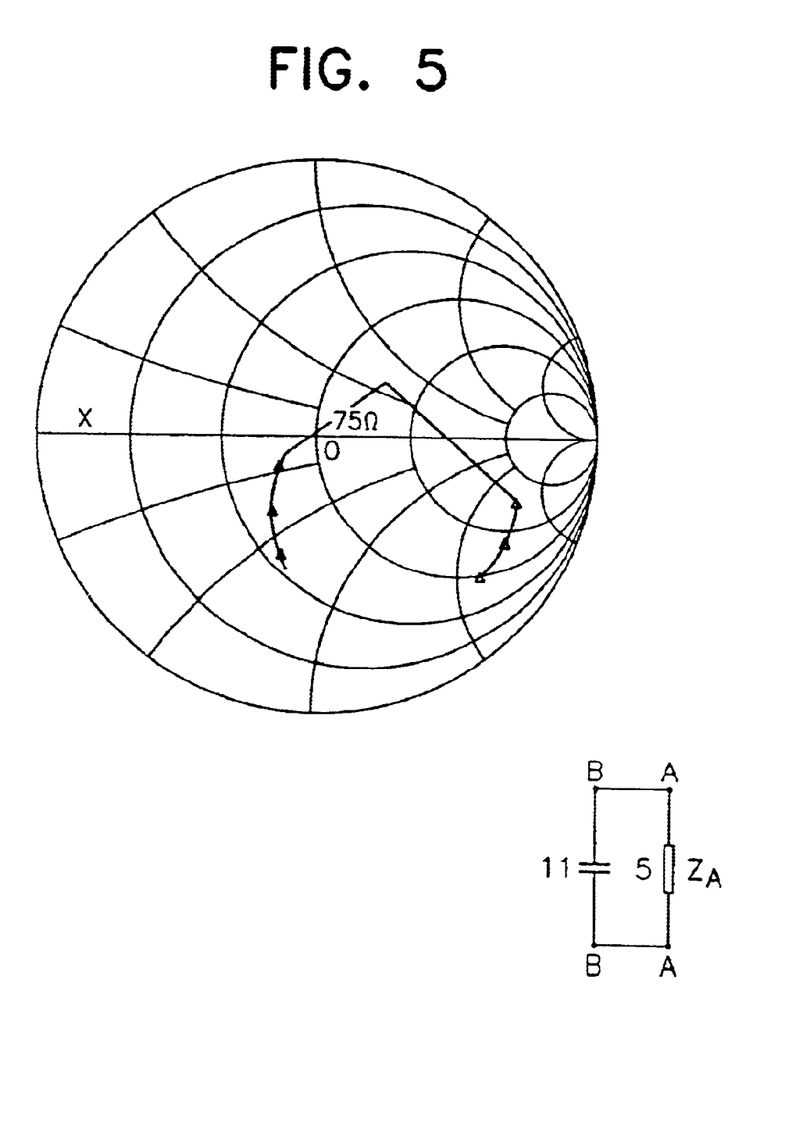
FIG. 5 is a Smith chart at point B—B in the coupling diagram.

There is chosen as the radiator (5) a dipole that has a first resonance point (P), see FIG. 4, in the first frequency band (where it functions as a half-wave dipole) and a second resonance point (Q) in the second frequency band (where it functions as a full-wave dipole). This radiator is balanced. The measurement ratio is between the width (B) of the dipole, see FIG. 2, and the length (I) is sufficiently large to cover the first frequency band. One dipole half is mounted on the first side of the printed circuit board, and the other dipole half on its other side. This enables the matching circuit and feeder (in the form of a microstrip) to be included in the pattern on said board.

The described choice of radiator means that its impedance in the gap will be approximately 60 Ohms in the first band and approximately 500 Ohms in the second band; see FIG. 4.

The antenna is constructed for a microstrip feeder that has characteristic impedance of 50 Ohms. The imbalance must be compensated for, when a microstrip or a coaxial conductor is unbalanced (non-symmetrical), whereas a dipole is balanced (symmetrical). The impedance difference in the second band must also be compensated for, and hence a matching circuit is necessary.

The matching circuit (8) for the first preferred embodiment consists of two parts:

Balun transformer (9) of a modified Klopfenstein-Duncan type, which is described below in a separate passage.

Transmission circuit (10), which is also described separately.

The Balun transformer and the transmission circuit are connected in series. In this example, a resistance of 75 Ohms with the smallest possible reactance was taken as a choice of impedance at the connecting point (Port F—F) between the transmission circuit (10) and the Balun transformer (9). This means that the transmission circuit was constructed for transformation of the impedances to 75 Ohms; see Table:

|  | Port A—A | Port F—F | VSWR without transmission circuit |
|---|---|---|---|
| First band | 60 Ohms | 75 Ohms | 1:1.25 |
| Second band | 500 Ohms | 75 Ohms | 1:6.67 |

The transmission circuit (10) transforms the impedance from Port A—A to Port F—F so that it increases slightly in the first band and decreases more in the second band. As a result, the impedance lands in the vicinity of the same value at all frequencies lying in the frequency bands in question, this value being 75 Ohms, for instance.

The Balun transformer (9) is constructed so that transformation takes place from 75 Ohms, balanced port (F—F) to 50 Ohms, unbalanced port (G—G). The modified Klopfenstein type is so broadbanded that its ports retain the same impedance within both frequency bands.

As seen from the dipole (5) through to the Balun transformer (9), the transmission circuit (10) consists of a parallel capacitor (11), two series inductances (13), two series capacitors (12), a phase shifting line (14), and a parallel capacitor (15), in that order. The reason why the series components are in pairs—something that is generally unnecessary—is because it is desired to maintain the symmetry in the structure between the dipole (5) and the Balun transformer (9). Each component in the transmission circuit changes the impedance curve in the Smith chart in its own way, as described hereinafter and illustrated to 50 Ohms.

Figure 6:
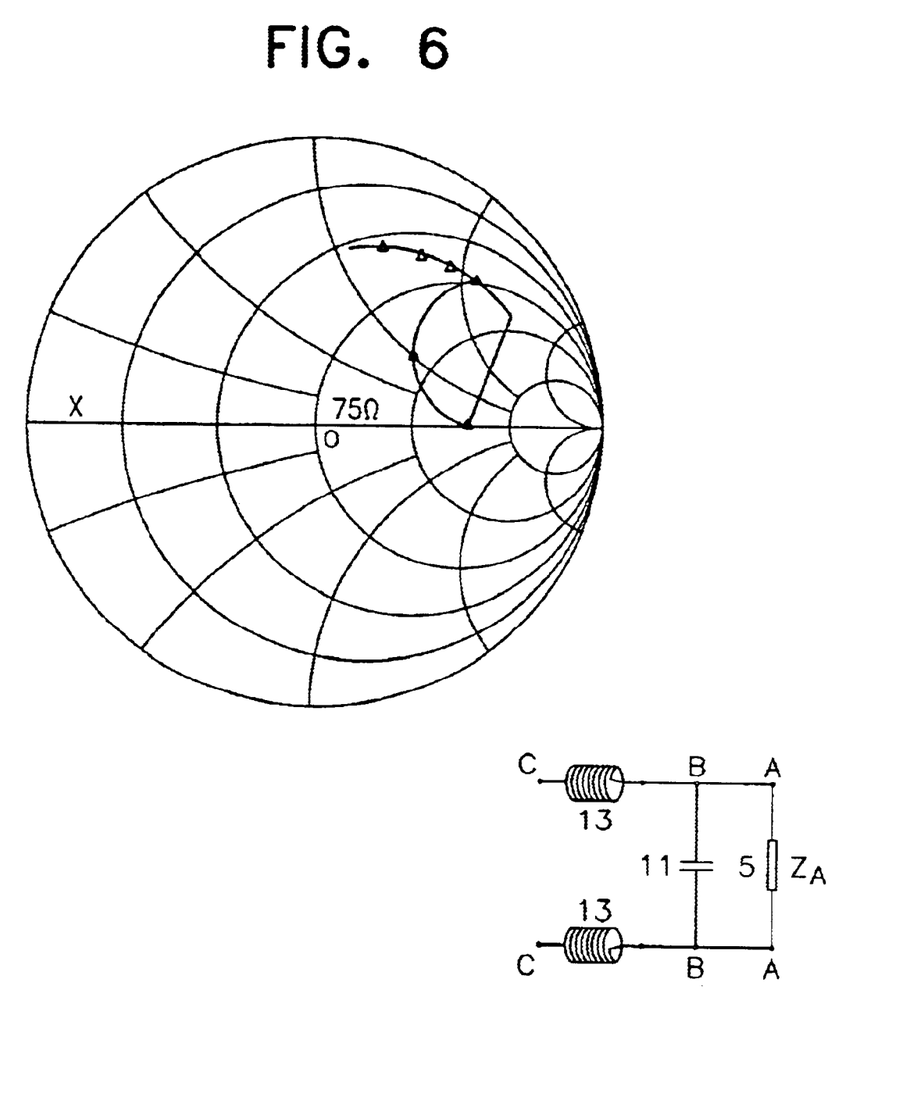
FIG. 6 is a Smith chart at point C—C in the coupling diagram.
Figure 7:
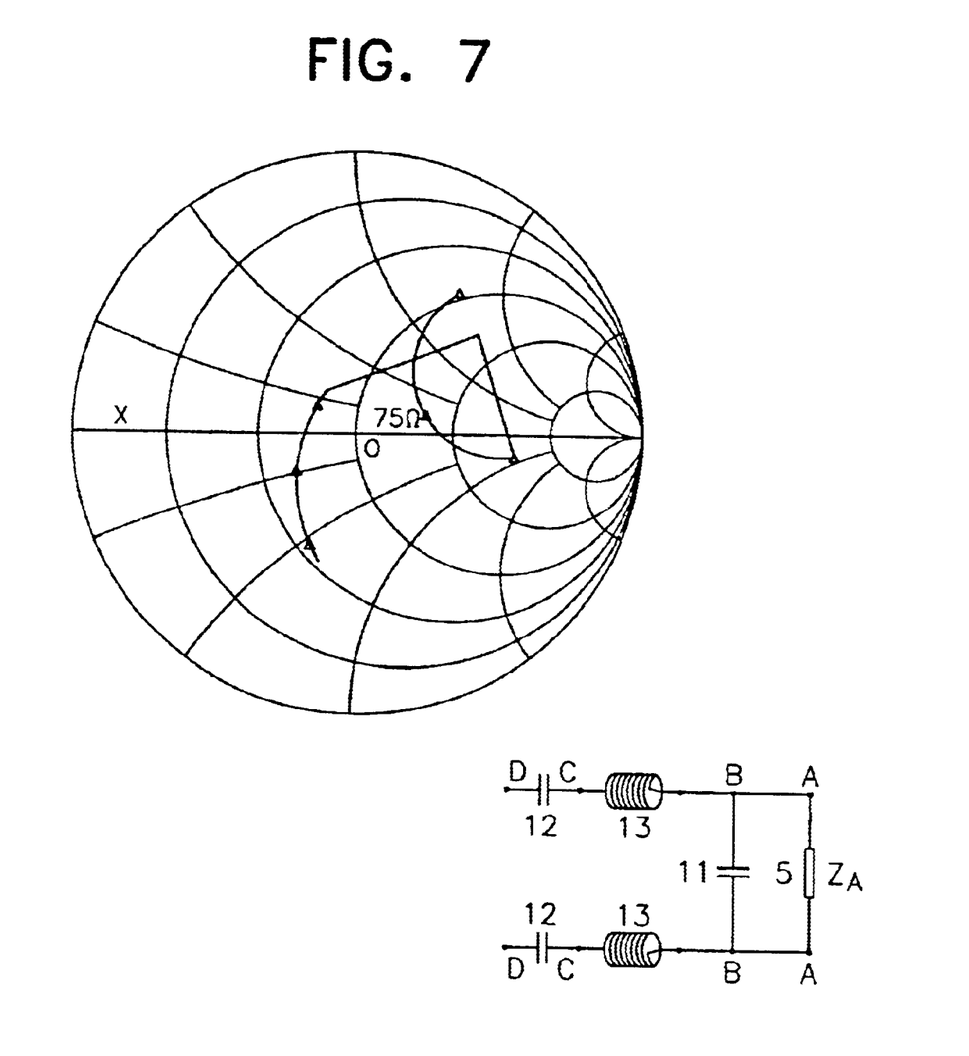
FIG. 7 is a Smith chart at point D—D in the coupling diagram
Figure 8:
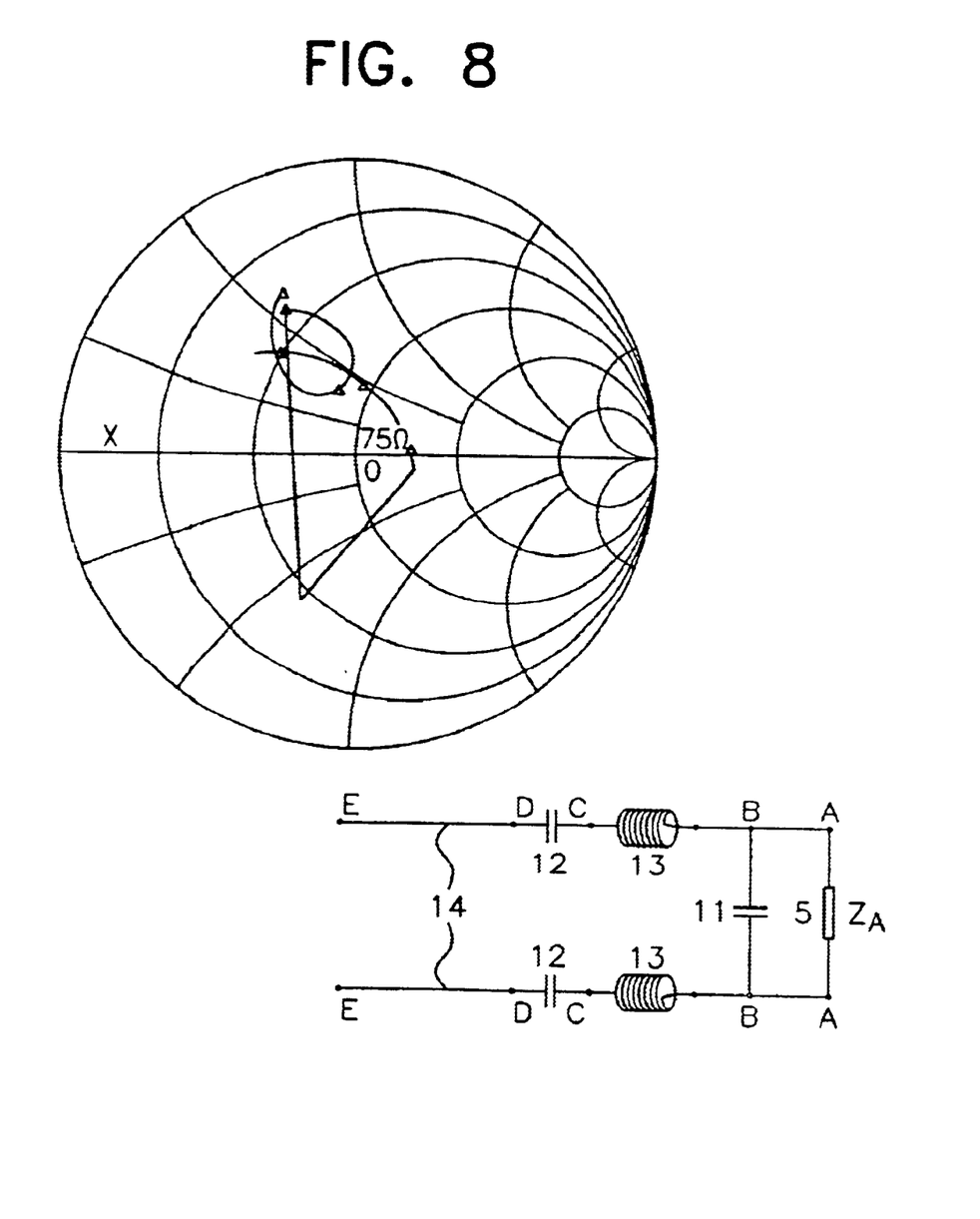
FIG. 8 is a Smith chart at point E—E in the coupling diagram.

The impedance (FIG. 4) of the dipole (5) shows that the curve intersects the real axis X at the following points: 60 Ohms in the first band (P) and 500 Ohms in the second band (Q). The dipole is thus resonant at these frequencies. The curve is moved downwards into the capacitive region of the Smith chart according to FIG. 5, with the aid of a parallel capacitor (11). The inductances (13) move the curve to the inductive region and draw the curve together to form a small loop as small loop as shown in FIG. 6. The curve is moved closer to the centre point (O) of the chart with the aid of series capacitors (12), therewith improving the balance of the curve in relation to the horizontal axis (X), see FIG. 7. The curve is then rotated through a phase angle of 130° (approximately) with the aid of a 75 Ohms phase-shifting line (14). The result will be apparent from FIG. 8. It is seen here that the markers in the first band lie in the proximity of the horizontal axis (X), while the markers in the second band lie on a coherent loop in the inductive part of the Smith chart. This last-mentioned loop is moved with the aid of the parallel capacitance (15) so as to lie around the centre point (O) of the Smith chart; see FIG. 9. The range of the first band is therewith influenced only to a small degree, since the capacitance (15) has less effect on the position of the points in the Smith chart at these lower frequencies.

It is generally known that isolated discrete elements (for instance resistances, capacitors, coils) or groups thereof can be replaced with equivalent networks of discrete and/or distributed elements (such as lines, stubs, patches) or their combinations. Similarly, distributed lines can be replaced with equivalent networks that include discrete elements. The units that can be obtained with this invention by conversions of this nature also lie within the protective scope of said invention.

Balun Transformer Theory

R. W. Klopfenstein describes a broadband Dolph-Tchebycheff circuit in the article.

*A Transmission Line Taper of Improved Design. Proceedings of the IRE,* pp. 31–35, 1956.

J. W. Duncan has further developed the theory, in order to obtain a broadband impedance transformer that is a Balun (balance—to unbalance converter) at the same time, according to the article:

100:1 *Bandwidth Balun Transformer. Proceedings of the IRE,* pp. 165–164, February 1960.

There is used for this invention a variant of the Balun transformer which is a further development of Duncan's suggestion, so that the circular structure is converted to a planar structure that can be connected directly to a microstrip.

Figure 11:
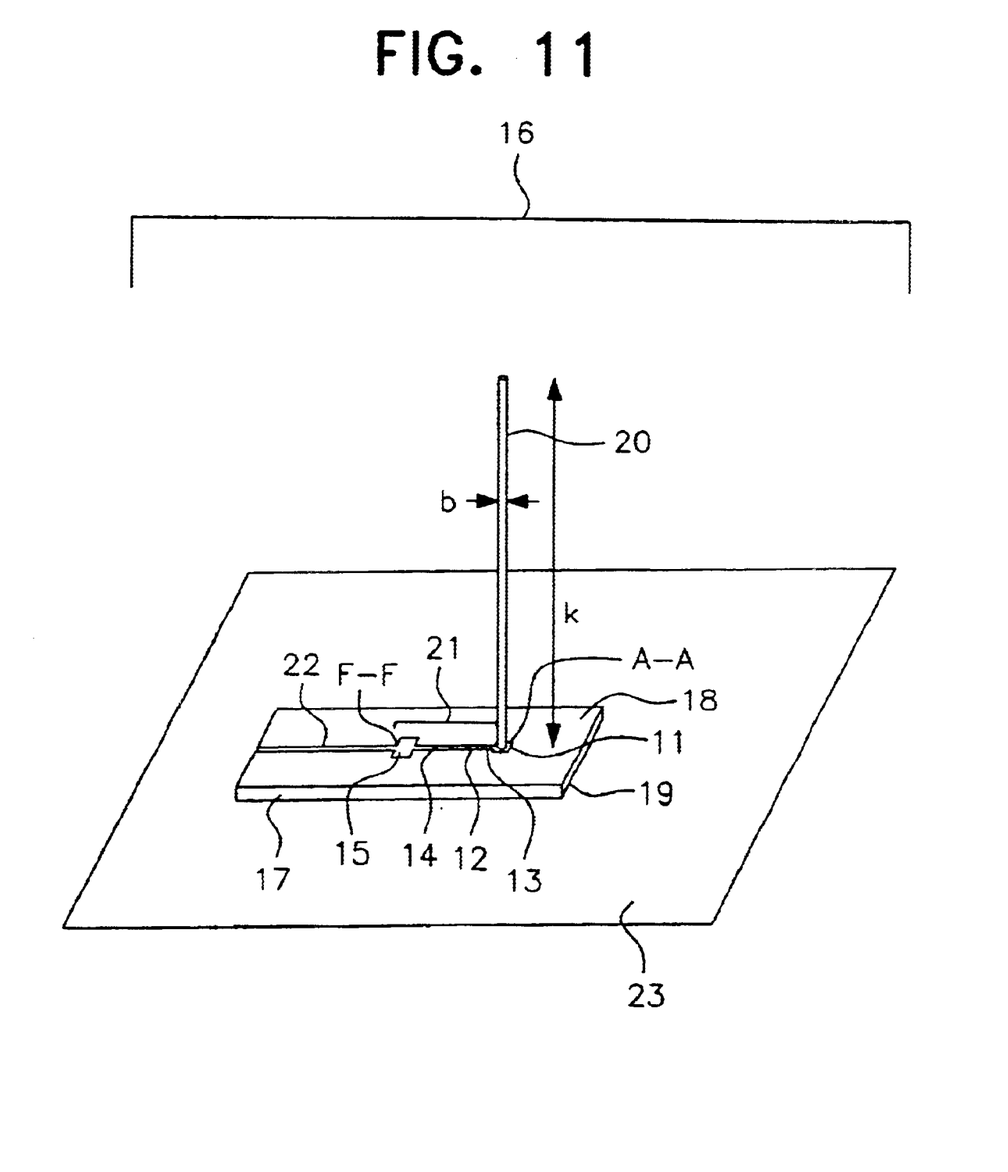
FIG. 11 illustrates an antenna with unbalanced radiator in a second preferred embodiment.

A Second Preferred Embodiment Including an Unbalanced Radiator Over the Earth Plane The antenna (16) shown in FIG. 11 consists of two parts:

Radiator (20)

Transmission circuit (21)

There is chosen as the radiator (20) a monopole over the earth plane (19, 23), having a first resonance point in the first frequency band (here it functions as a quarter-wave monopole) and with a second resonance point in the other frequency band (where it functions as a half-wave monopole). The measurement ratio between the width (b) and the length (k) of the monopole is chosen to be large enough to cover the first frequency band.

The transmission circuit (21) is mounted on a printed circuit board (17) that has a first and a second side (18 and 19 respectively). Both sides are metallised and carry patterns.

The radiator is placed perpendicular to the first side of the printed circuit board (17), the metal pattern on said first side (18) being one side of the transmission circuit (21). The other side of the transmission circuit (21) and part of the earth plane are mounted on the other side (19) of the printed circuit board. The feeder (22) in the form of a microstrip can also be mounted on the printed circuit board (17).

A Balun transformer is not required for monopole radiators.

The aforedescribed choice of radiator (20) means that its impedance in the gap will be approximately 30 Ohms in the first band and approximately 300 Ohms in the second band.

The antenna is constructed for feeding with an unbalanced line that has a characteristic impedance of 50 Ohms. The transmission circuit is also needed in this case for impedance matching in the second band. No Balun transformer is required on the other hand.

The impedance at the connection point (Port F—F) between the transmission circuit (21) and the feeder (22) in this example will preferably have a resistance of 50 Ohms and the smallest possible reactance. This means that the transmission circuit is designed to transform impedances in the following manner:

|  | Port A—A | Port F—F | VSWR without transmissioncircuit |
|---|---|---|---|
| First band | 30 Ohms | 50 Ohms | 1:1.67 |
| Second band | 300 Ohms | 50 Ohms | 1:6 |

The transmission circuit transforms impedance from Port A—A to Port F—F so that it increases slightly in the first band and decreases significantly in the second band. As a result, the impedance will lie in the proximity of the same value, in this example 50 Ohms, at all frequencies that lie in the frequency bands concerned.

The description of the transmission circuit for the first preferred embodiment also applies in this case, although with the difference that the serial components need not be placed in pairs, since both the radiator and the lines are unbalanced. The aforesaid concerning equivalent exchanges of discrete, distributed elements, and groups also applies here.

The principles for processing the curve in the Smith charts described in connection with the first preferred embodiment also apply here The Smith charts can suitably be normalised to 50 Ohms.

Designations

1. The entire dipole antenna
2. Printed circuit board for the dipole antenna
3. First side of a printed circuit board for the dipole antenna
4. Second side of the printed circuit board for the dipole antenna (not shown in the Figure)
5. Radiator (dipole)
6. One dipole half
7. Other dipole half
8. Dipole antenna matching circuit
9. Dipole antenna Balun transformer
10. Dipole antenna transmission circuit
11. Parallel capacitor
12. Series capacitor
13. Series inductance
14. Phase-shifting line
15. Parallel capacitor
16. The entire monopole antenna
17. A printed circuit board for the monopole antenna
18. First side of the printed circuit board
19. Second side of the printed circuit board with earth plane
20. Radiator (monopole)
21. Transmission circuit for the single-pole antenna
22. Feeder line
23. Conductive surface elements

| | |
|---|---|
| A—A | First port of the transmission circuit |
| F—F | Second port of the transmission circuit |
| G—G | Connecting port for unbalanced line |
| b | The width of the radiator |
| l | The length of the dipole |
| k | The length of the monopole |
| O | The centre of the Smith chart |
| X | The horizontal axis of the Smith chart |
| ZA | Antenna impedance |
| P | The resonance point of the radiator in the first band |
| Q | The resonance point of the radiator in the second band |
| ZG | Impedance of the radio apparatus or the feeder line |
| UG | Source voltage of the radio apparatus |

What is claimed is:

1. A transmission circuit, comprising a first port (A—A) and a second port (F—F) for use with a radiator for radio waves within a first frequency band where a radiation resistance of the radiator is low, and a second frequency band where a radiation resistance of the radiator is high, said first port (A—A) of the transmission circuit for matching to an impedance of the radiator, said second port (F—F) for matching to an impedance of a feeder line, wherein the second frequency band lies approximately one octave higher than the first frequency band, wherein a real part of the impedance at the second port (F—F) is greater than a real part of the impedance at the first port (A—A) within the first frequency band, and wherein a real part of the impedance at the second port (F—F) is smaller than a real part of the impedance at the first port (A—A) within the second frequency band, said transmission circuit having components including, when viewed from said first port (A—A) to said second port (F—F), at least one parallel capacitor, at least one series inductance, at least one series capacitor, at least one phase shift line and at least one parallel capacitor, in that order, said components transforming the impedance in the first and second frequency bands at the first port (A—A) to the second port (F—F) so that the impedance at the second port (F—F) has approximately the same value within both frequency bands.

2. The transmission circuit according to claim 1, wherein at least one of said components is replaced by at least one equivalent component which may be both discrete and distributed.

3. The transmission circuit according to claim 1, wherein said components are in series, and said series components have been doubled to achieve symmetry, and to balance said radiator.

4. Matching circuit for a symmetrical radiator, wherein the transmission circuit is constructed in accordance with claim 1 and has connected to the second port (F—F) a broadband-type Balun transformer originating therefrom of microstrip or stripline or a multi-stage transformer.

5. The antenna consisting of a balanced radiator and matching circuit according to claim 4, which is mounted on a double-sided printed circuit board.

6. The antenna consisting of unbalanced radiator and transmission circuit according to claim 1.

7. The antenna according to claim 6, wherein the transmission circuit and earth plane are mounted on a same printed circuit board.

8. The antenna according to claim 7, wherein the earth plane of the printed circuit board has been expanded with a larger conductive surface element coupled thereto.

9. A transmission circuit, comprising:

a first port (A—A) and a second port (F—F) for use with a radiator for radio waves within a first frequency band where a radiation resistance of the radiator is low, and a second frequency band where a radiation resistance of the radiator is high, said first port (A—A) of the transmission circuit for matching to an impedance of the radiator, the second port (F—F) for matching to an impedance of a radio apparatus, wherein the second frequency band lies approximately one octave higher than the first frequency band, wherein a real part of the impedance at the second port (F—F) is greater than a real part of the impedance at the first port (A—A) within the first frequency band, and wherein a real part of the impedance at the second port (F—F) is smaller than a real part of the impedance at the first port (A—A) within the second frequency band, said transmission circuit having components including, when viewed from the first port (A—A) to the second port (F—F), at least one parallel capacitor, at least one series inductance, at least one series capacitor, at least one phase shift line and at least one parallel capacitor, in that order, said components transforming the impedance in the first and second frequency bands at the first port (A—A) to the second port (F—F) so that the impedance at the second port (F—F) has approximately the same value within both frequency bands.

* * * * *